United States Patent [19]

van de Grift et al.

[11] Patent Number: 4,812,816

[45] Date of Patent: Mar. 14, 1989

[54] ELECTRONIC CIRCUIT WITH COMPLEMENTARY DATA LINE

[75] Inventors: Robert E. J. van de Grift; Martien van der Veen, both of Eindhoven, Netherlands

[73] Assignee: U.S. Philips Corporation, New York, N.Y.

[21] Appl. No.: 94,224

[22] Filed: Sep. 8, 1987

[30] Foreign Application Priority Data

Sep. 11, 1986 [NL] Netherlands ................ 8602294

[51] Int. Cl.[4] ........................................... H03M 1/38
[52] U.S. Cl. .................... 341/133; 307/299.2; 341/155
[58] Field of Search .............. 307/250, 261, 299 A, 307/299.1, 299.2, 299.3; 340/347 AD Primary Examiner—William M. Shoop, Jr.
Assistant Examiner—Richard K. Blum
Attorney, Agent, or Firm—Steven R. Biren

[57] ABSTRACT

In conventional digital-to-analog converters one of a number of multi-emitter transistors is driven by means of the select logics, the emitters of which are connected selectively to a group of data lines. The output circuits connected to the data lines further receive a reference voltage to be able to detect the condition on the data lines. In the analog converter according to the invention each data line is constructed so as to be complementary in which the emitters which in the prior art circuit arrangement are connected to the first group of data lines are coupled in the same manner to a first group of data lines while the remaining emitters are now connected to complementary lines from the second group. The output circuits which are connected to the data lines receive a logic signal of a data line and the complementary logic signal of the associated complementary data line. The result is that the voltage step which is presented to the inputs of the output circuits is twice as large. As a result of this the interference sensitivity is reduced because the margin of the voltage difference to be detected has become twice as large. A further advantage of the converter according to the invention is that a reference voltage for detecting the logic condition on the data lines is superfluous.

3 Claims, 1 Drawing Sheet

ELECTRONIC CIRCUIT WITH COMPLEMENTARY DATA LINE

BACKGROUND OF THE INVENTION

The invention relates to an electronic circuit in which selection means select a transistor from a group of $2^n$ multi-emitter transistors each having n emitters under the control of an input signal and make it conductive, of which emitters a selection is connected to n data lines, which data lines further are each connected on the one hand to a current source and on the other hand to an output circuit for generating at the output of the output circuit a binary output signal belonging to a given input signal.

Such a circuit arrangement is known from British GB.PS No. 1,547,918, in which a completely parallel operating analog-to-digital converter is described. In this a-d converter the data on the data lines are compared with a reference voltage by an output circuit to establish whether the data lines carry a logic high or logic low signal. Such a circuit arrangement usually has a small logic stroke (voltage difference between the logic high and low signal) and as a result of this also has a low interference margin. Increasing the logic stroke usually is not possible because only a small voltage range is available in the bipolar very rapidly operating logic often used for this type of circuit arrangements.

SUMMARY OF THE INVENTION

It is the object of the invention to provide an electronic circuit arrangement in which the interference sensitivity is reduced and in which the use of a reference voltage for detecting the logic levels on the data lines is superfluous.

An electronic circuit arrangement according to the invention is characterized in that n pairs of data lines are provided the n pairs of data lines being connected to the multi-emitter transistors in such a manner that each pair of data lines always carries complementary logic signals.

DESCRIPTION OF THE DRAWING

The invention will be described in greater detail with reference to the drawing, in which.

DESCRIPTION OF THE PREFERRED EMBODIMENTS

Figure 1:
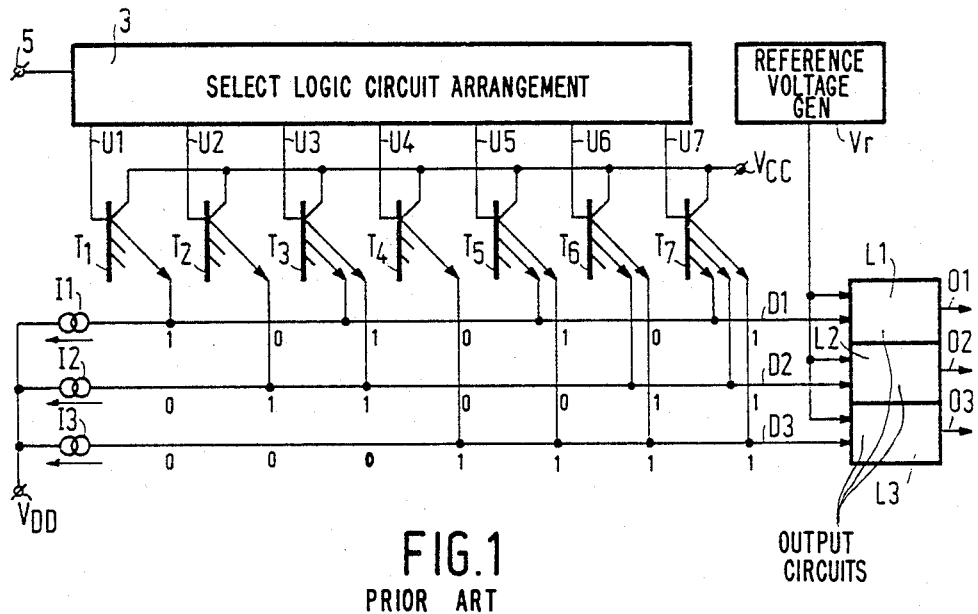
FIG. 1 is a prior art electronic circuit arrangement.

FIG. 1 shows in brief a prior art analog-to-digital converter circuit arrangement.

FIG. 1 shows a select logic circuit arrangement 3 with which at most one out of the seven transistors T1 to T7 is selected with reference to a input signal which is applied to input 5. For this purpose, the bases of the transistors T1 to T7 are connected to outputs U1 to U7. The collectors of the transistors T1 to T7 are connected in common to the supply voltage VCC. The emitters of the transistors T1 to T7 are selectively connected to the data lines D1 to D3 which further are connected on the one hand to current sources I1 to I3 and on the other hand to output circuits L1 to L3. The current sources I1 to I3 are further connected to a second supply source VDD which has a lower potential than VCC. The output circuits L1 to L3 are each provided with a further input to which a reference voltage is applied which is generated by the reference voltage generator VR.

If the input voltage applied to the input 5 exceeds a first threshold, transistor T1 will become conductive. When a second, third . . . seventh threshold voltage is exceeded by the input voltage respectively the second transistor T2, third transistor T3 . . . seventh transistor T7 respectively will become conductive. The one out of the seven conductive transistors T1 to T7 activate one or more lines D1, D2, D3. This activation is such that the transistors T1 to T7 bring the binary codes 001 to 111 on the data lines D1 to D3, which binary codes are copied into the output circuit arrangements L1 to L3. The output circuits L1, L2, L3 preferably are latch circuits which retain the data on the data lines D1 to D3 after copying and put them on their outputs O1, O2 and O3. The voltage step on the data lines D1 to D3 between the logic high and logic low signals is rather low in the binary transistor technique used, in which the applied reference voltage which is to be generated by the source VR should be halfway between the logic high and logic low level. The result of this is that the known circuit arrangement has a high interference sensitivity.

Figure 2:
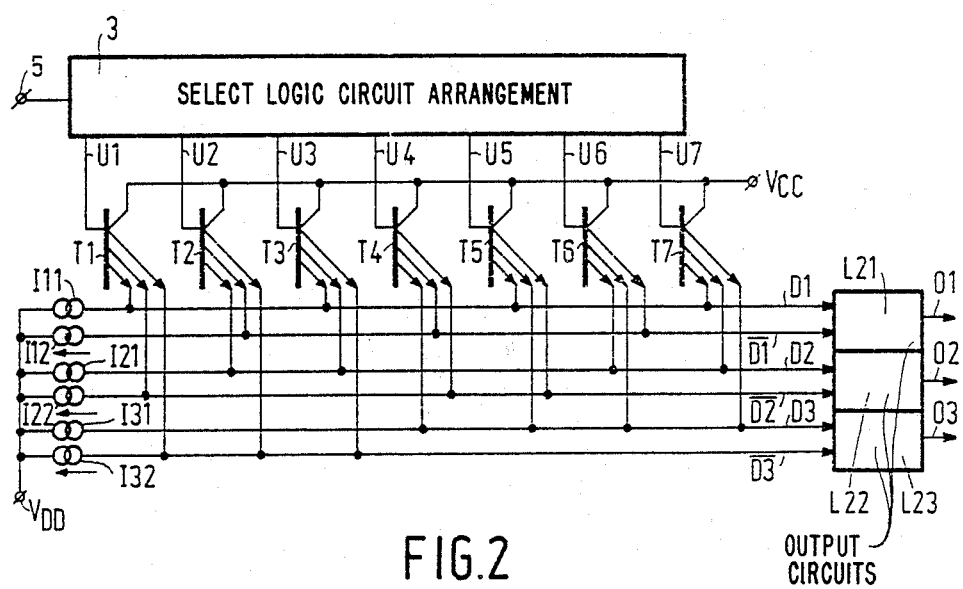
FIG. 2 shows an electronic circuit arrangement according to the invention.

FIG. 2 shows a circuit arrangement according to the invention in which the elements corresponding to FIG. 1 are referred to by corresponding reference numerals. A second group of data lines $\overline{D1}, \overline{D2}$ and $\overline{D3}$ are added to the group of data lines D1, D2, and D3, in which the first group of data lines and the second group of data lines always carry complementary logic signals. The emitters of the transistors T1 to T7 are connected to the data lines D1 to D3 in the same manner as in FIG. 1. The emitters of the transistors T1 to T7 which are not connected to data lines in FIG. 1 are now connected to the second group of data lines $\overline{D1}$ to $\overline{D3}$. A first emitter of transistor T1 is connected to the data line $\overline{D1}$ and a second and third emitter, respectively, are connected to the second data line $\overline{D2}$ and the third data line $\overline{D3}$, respectively, from the second group. Each data line from the first and second group is connected via a current source $I_{11}, I_{12}, I_{21}.....I_{32}$ to the second supply source point VDD. On the other hand, the data lines D, $\overline{D1}$ and D2, $\overline{D2}$ and D3, $\overline{D3}$ are connected to the respective output circuits L21, L22, L23. For example, the output circuit L21 receives the logic signals on the output line D1 and the output line $\overline{D1}$. Since these signals are complementary the output circuit receives the voltage difference between the logic high and logic low level at its input which is twice as large as the voltage difference at the inputs of the output circuit L1 of FIG. 1. The result is that the output circuit L21 sees a twice as large voltage step at its input and hence will be less sensitive to interference. The same situation occurs for the output circuits L22 and L23. The output circuits L21 to L23 are preferably latch circuits which, after receiving the logic signals of the data lines store and transmit them to their outputs O1, O2 and O3.

What is claimed is:

1. An electronic circuit arrangement comprising selection logic circuit means having an input and $2^n$-1 outputs, a group of $2^n$-1 multi-emitter bipolar transistors, each transistor having n emitters, said $2^n$-1 selection logic circuit outputs being connected, respectively, to the bases of said $2^n$-1 transistors, a group of n pairs of data lines, a current source connected to each data line, and an output circuit connected to each pair of data lines, said n emitters of each transistor being connected to said n pairs of data lines in such a manner that each pair of data lines always carries complementary logic signals during circuit operation.

2. An electronic circuit arrangement as in claim 1, wherein the n emitters of each of said transistors are connected to n different data lines, one from each of said n pairs of data lines.

3. An analog-to-digital converter having an electronic circuit arrangement comprising selection logic circuit means having an input $2^n-1$ outputs, a group of $2^n-1$ multi-emitter bipolar transistors, each transistor having n emitters, said $2^n-1$ selection logic circuit outputs being connected, respectively, to the bases of said $2^n-1$ transistors, a group of n pairs of data lines, a current source connected to each data line, and an output circuit connected to each pair of data lines, said n emitters of each transistor being connected to said n pairs of data lines in such a manner that each pair of data lines always carries complementary logic signals during circuit operation.

* * * * *